(12) United States Patent
Kim

(10) Patent No.: US 11,457,711 B2
(45) Date of Patent: Oct. 4, 2022

(54) SMART MEDICINE CASE UNIT AND SMART MONITORING METHOD FOR TAKING MEDICINE UTILIZING THE SMART MEDICINE CASE UNIT

(71) Applicant: Do Yeon Kim, Seoul (KR)

(72) Inventor: Do Yeon Kim, Seoul (KR)

( * ) Notice: Subject to any disclaimer, the term of this patent is extended or adjusted under 35 U.S.C. 154(b) by 218 days.

(21) Appl. No.: 16/893,932

(22) Filed: Jun. 5, 2020

(65) Prior Publication Data
US 2020/0390211 A1 Dec. 17, 2020

(30) Foreign Application Priority Data
Jun. 11, 2019 (KR) .................. 10-2019-0068629

(51) Int. Cl.
*A45C 15/06* (2006.01)
*A61J 7/04* (2006.01)
*A45C 11/00* (2006.01)
*G01R 33/07* (2006.01)

(52) U.S. Cl.
CPC ............. *A45C 15/06* (2013.01); *A61J 7/0481* (2013.01); *A45C 2011/007* (2013.01); *G01R 33/07* (2013.01)

(58) Field of Classification Search
CPC ...................................................... A45C 15/06
See application file for complete search history.

(56) References Cited

U.S. PATENT DOCUMENTS

| 9,839,583 | B2 * | 12/2017 | Kim ...................... A61J 7/0069 |
| 10,105,288 | B1 * | 10/2018 | Nosrati .................. A61J 7/0069 |
| 10,610,457 | B1 * | 4/2020 | Patel ...................... G16H 40/63 |
| 2005/0087473 | A1 * | 4/2005 | Fabricius ................ A61J 1/035 |
| | | | 206/534 |
| 2005/0252924 | A1 * | 11/2005 | Pieper ................... A61J 7/0481 |
| | | | 221/25 |
| 2014/0203021 | A1 * | 7/2014 | Zill ....................... A61J 7/0084 |
| | | | 220/500 |
| 2016/0000657 | A1 * | 1/2016 | Dickie .................. A61J 7/0084 |
| | | | 206/534 |

(Continued)

FOREIGN PATENT DOCUMENTS

| KR | 10-1684854 B1 | 12/2016 |
| KR | 2018-0054220 A | 5/2018 |

*Primary Examiner* — Travis R Hunnings

(74) *Attorney, Agent, or Firm* — Novick, Kim & Lee, PLLC; Sang Ho Lee; Hyun Woo Shin

(57) ABSTRACT

Provided is a smart medicine case unit including: a main case having an accommodation space to store a component therein; a medicine case accommodated in the accommodation space of the main case, the medicine case including a plurality of medicine compartments that are partitioned to separately accommodate various types of medicine and respectively include light-transmitting holes through which light is transmitted; a circuit board arranged between the medicine case and the main case, wherein an optical sensor provided at a position corresponding to each of the light-transmitting holes and a communication device configured to transmit a signal sensed by the optical sensor to a mobile terminal such as a smartphone are mounted on the circuit board; and a top cover rotatably coupled to the main case to selectively open and close the medicine compartments of the medicine case by a rotational motion.

4 Claims, 5 Drawing Sheets

(56) References Cited

U.S. PATENT DOCUMENTS

| | | | | |
|---|---|---|---|---|
| 2016/0074283 | A1* | 3/2016 | Aggarwal | A61J 7/04 |
| | | | | 206/534 |
| 2019/0086326 | A1* | 3/2019 | Zhang | A61J 7/0076 |
| 2019/0105235 | A1* | 4/2019 | Seo | G06Q 50/22 |
| 2020/0085694 | A1* | 3/2020 | Patel | G08B 21/24 |
| 2021/0154103 | A1* | 5/2021 | Kaufmann | A61J 7/049 |

\* cited by examiner

SMART MEDICINE CASE UNIT AND SMART MONITORING METHOD FOR TAKING MEDICINE UTILIZING THE SMART MEDICINE CASE UNIT

BACKGROUND

1. Field

One or more embodiments relate to a smart medicine case unit, and more particularly, to an improved smart medicine case unit and a smart monitoring method for taking medicine utilizing the smart medicine case unit, which may help a user to take a correct dose of medicine or dietary supplement on time without omission.

2. Description of the Related Art

In general, a person having a disease should take medicine at every predetermined time for treatment, and even a person having no disease needs to take a dietary supplement for reasons such as nutritional balance or health promotion.

It has been known that the medicine or dietary supplement works when a correct dose is taken on time. In particular, it is very important for patients with chronic diseases such as diabetes, heart disease, and other diseases to take a correct dose of medicine at a predetermined time continuously for a long term.

There are portable medicine cases used to take a correct dose of medicine or dietary supplement at a predetermined time. However, those medicine cases prevent a user from forgetting to carry the medicine or dietary supplement when going out in daily life, and are mainly for storage and carrying. Thus, it is impossible to induce the user to take a correct dose of medicine or dietary supplement at a predetermined time.

SUMMARY

To solve the issues as stated above, a smart medicine case unit and a smart monitoring method for taking medicine utilizing the smart medicine case unit may help a user to take a correct dose of medicine or dietary supplement at a predetermined time.

One or more embodiments include a smart medicine case unit including a main case having an accommodation space to store a component therein; a medicine case accommodated in the accommodation space of the main case, the medicine case including a plurality of medicine compartments that are partitioned to separately accommodate various types of medicine and respectively include light-transmitting holes through which light is transmitted; a circuit board arranged between the medicine case and the main case, wherein an optical sensor provided at a position corresponding to each of the light-transmitting holes and a communication device configured to transmit a signal sensed by the optical sensor to a mobile terminal such as a smartphone are mounted on the circuit board; and a top cover rotatably coupled to the main case to selectively open and close the medicine compartments of the medicine case by a rotational motion.

The smart medicine case unit may further include a Hall sensor provided on the circuit board; a magnet provided in the top cover at a position corresponding to the Hall sensor; and a magnetic body positioned between the Hall sensor and the magnet to allow a magnetic force of the magnet to reach the Hall sensor.

The smart medicine case unit may further include a subcase accommodated in the accommodation space of the main case, wherein the subcase is arranged between the circuit board and the medicine case, has a single unpartitioned space, and includes a plurality of light-transmitting holes formed at positions corresponding to the light-transmitting holes of the medicine case.

The smart medicine case unit may further include, to sense whether the medicine case is separated when only the subcase is used by separating the medicine case from the subcase, a Hall sensor mounted on the circuit board and a magnet provided in the medicine case at a position corresponding to the Hall sensor.

One or more embodiments include a smart monitoring method for taking medicine, including, to monitor whether medicine is taken by a user, by using the smart medicine case unit described above, sensing, through the optical sensor, whether a pill is placed on a light-transmitting hole of the medicine compartment of the medicine case, transmitting a result of the sensing to a mobile terminal of a user through the communication device, and displaying an image or a message corresponding to the result of the sensing on a display device of the mobile terminal or informing the user of the result of the sensing.

Additional aspects will be set forth in part in the description which follows and, in part, will be apparent from the description, or may be learned by practice of the presented embodiments.

According to one or more embodiments, the smart medicine case unit configured as described above may produce an effect of preventing a user from taking the same medicine over again as the smart medicine case unit has an easy-to-carry medicine case structure including a plurality of medicine compartments partitioned to separately accommodate different substances to be taken, such as medicine or dietary supplements, and an effect of allowing the user to monitor, by utilizing a smartphone, whether a correct dose of a substance to be taken is held and whether the substance is taken at a predetermined time, as the smart medicine case unit is configured to sense, through optical sensors, whether a substance to be taken is properly held in each medicine compartment and whether a correct dose of the substance is taken at a predetermined time and transmit the sensed values to the smartphone through a Bluetooth communication network.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
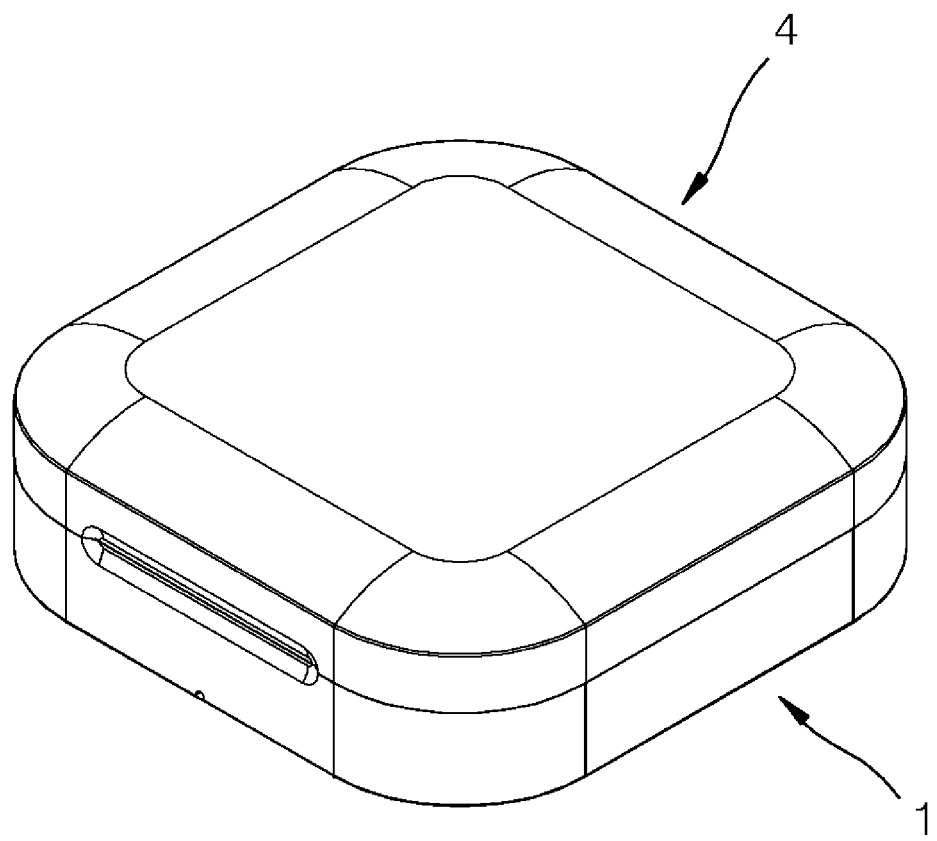
FIG. 1 is a perspective view according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, a smart medicine case unit according to an embodiment will be described in detail with reference to the accompanying drawings.

Figure 2:
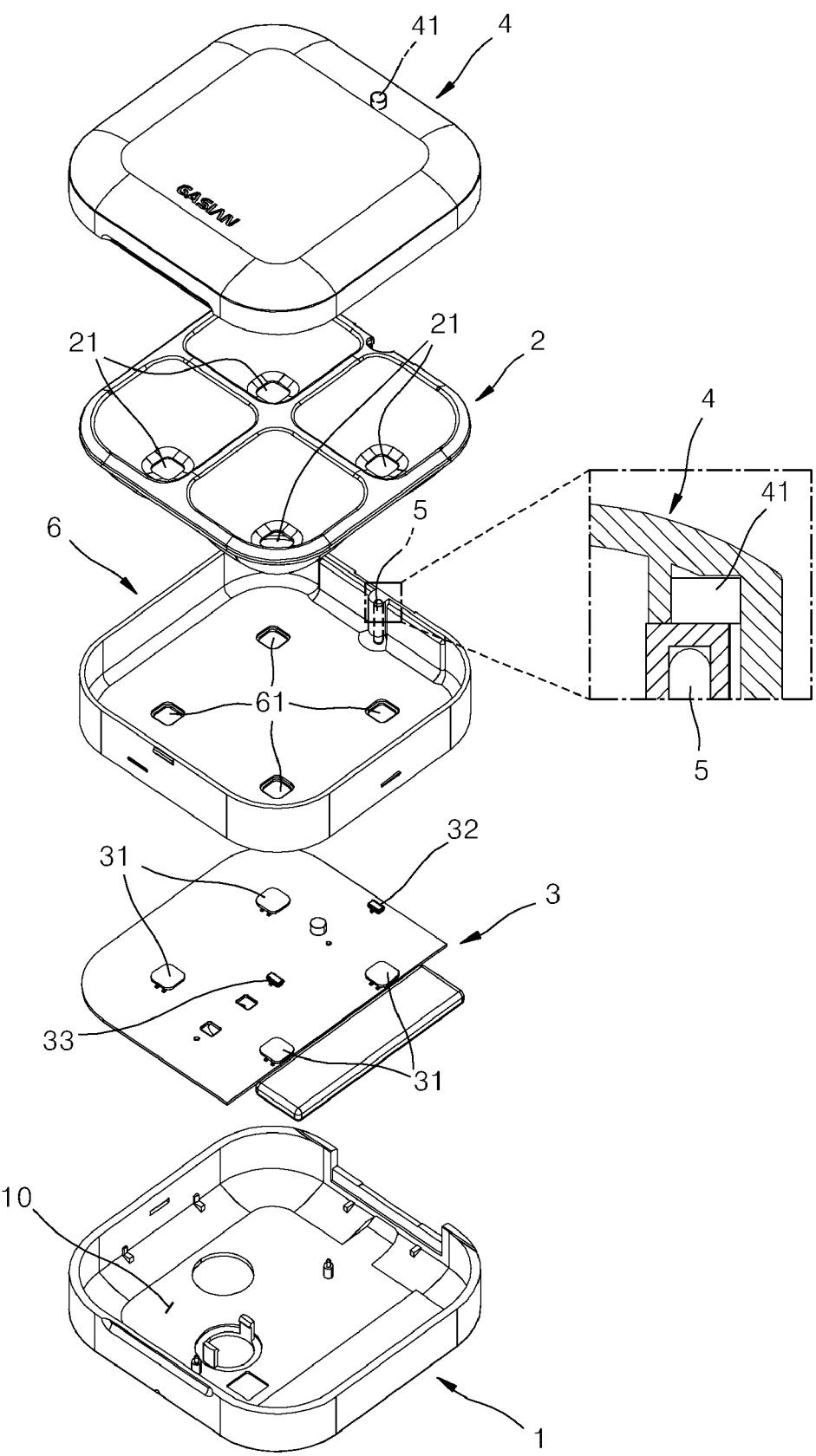
FIG. 2 is an exploded perspective view according to an embodiment.
Figure 3:
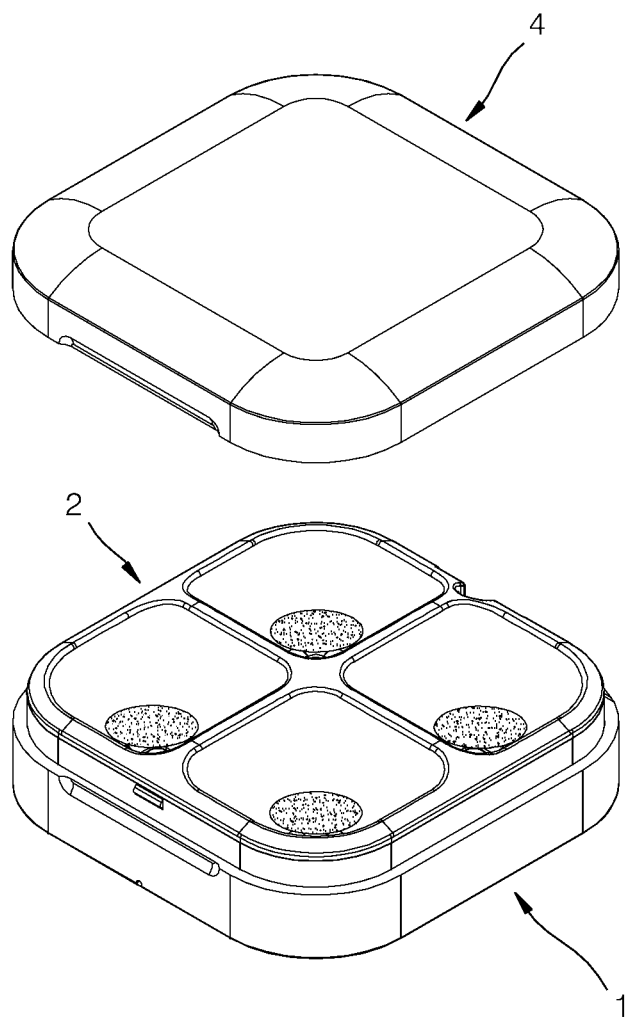
FIGS. 3 and 4 are views illustrating a use state according to an embodiment.
Figure 4:
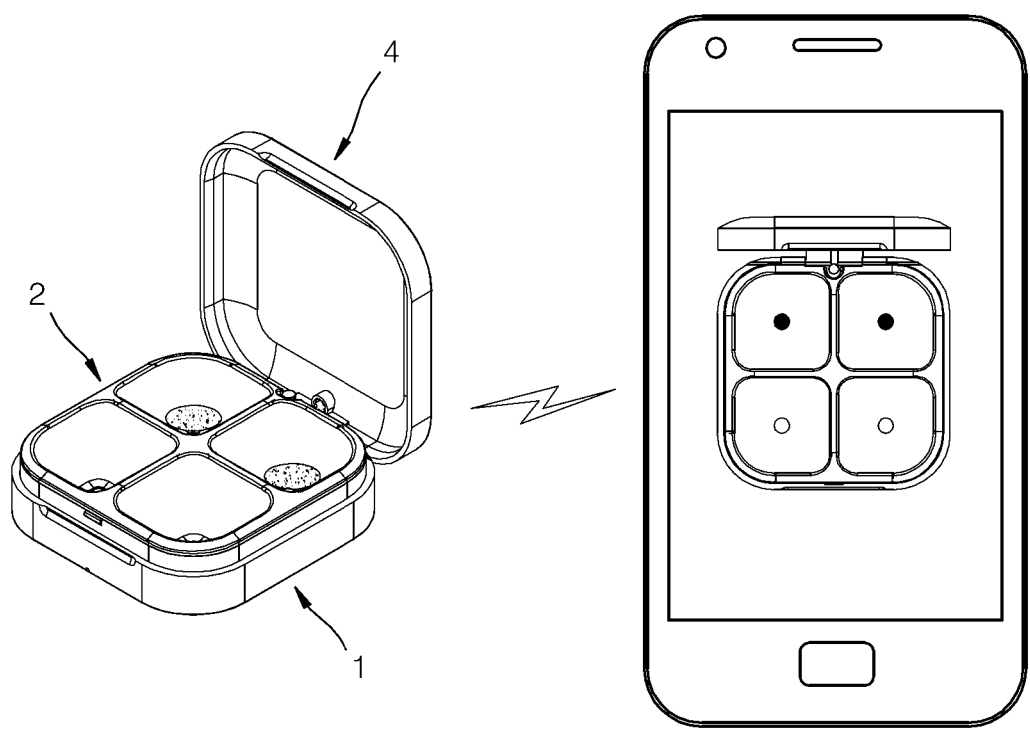
Figure 5:
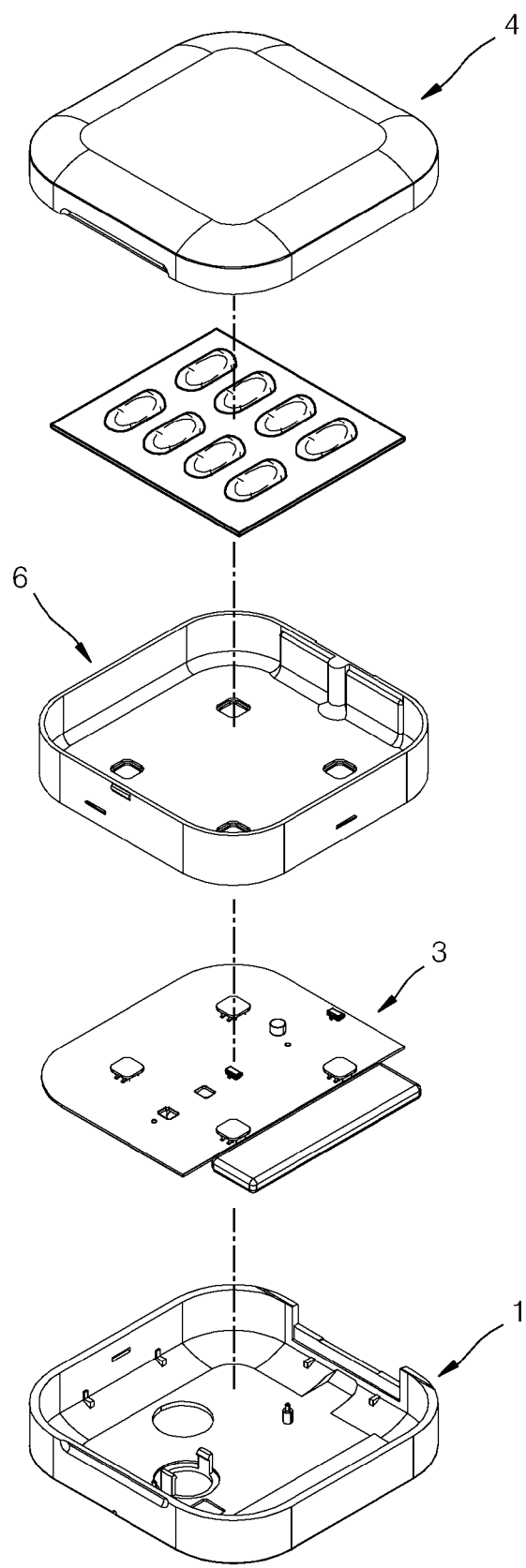
FIG. 5 is a view illustrating another use state according to an embodiment.

FIG. 1 is a perspective view according to an embodiment, FIG. 2 is an exploded perspective view according to an embodiment, FIGS. 3 and 4 are views illustrating a use state according to an embodiment, and FIG. 5 is a view illustrating another use state according to an embodiment.

As shown in FIGS. 1 and 2, a smart medicine case unit according to an embodiment may be utilized to inform a user of whether a correct dose of medicine or dietary supplement is carried with him or her, or of whether the medicine or dietary supplement is taken at a predetermined time, so that the user may take the correct dose of medicine or dietary supplement at the predetermined time in daily life. The smart medicine case unit includes a main case 1, a medicine case 2, a circuit board 3, and a top cover 4.

As shown in FIG. 2, the main case 1 includes an accommodation space 10 provided in the shape with an opened top to store a component therein. The medicine case 2 is arranged in the accommodation space 10 of the main case 1 and includes medicine compartments to hold a substance to be taken such as medicine or dietary supplement.

The plurality of medicine compartments of the medicine case 2 are partitioned to separately accommodate various types of medicine and respectively include light-transmitting holes 21 through which light is transmitted. The light-transmitting holes 21 transmit light and are selectively opened and closed depending on whether a substance to be taken is placed in the medicine compartments, thereby enabling selective blocking of light transmission paths.

The circuit board 3 is configured to mount thereon components for monitoring whether a substance to be taken is held in a medicine compartment of the medicine case 2 or whether a correct dose of the substance in the medicine compartment is taken at a predetermined time, and is arranged, as shown in FIG. 2, between the medicine case 2 and the main case 1.

For example, optical sensors 31 provided at positions corresponding to the respective light-transmitting holes 21, and a communication device (not shown) configured to transmit signals sensed by the optical sensors 31 to a mobile terminal such as a smartphone are mounted on the circuit board 3.

The optical sensors 31 project electromagnetic waves such as infrared rays to the light-transmitting holes 21 of the medicine compartments, and sense different values depending on whether the light-transmitting holes 21 are closed by the substances accommodated in the medicine compartments.

The communication device transmits the sensed values to the mobile terminal such as a smartphone, thereby allowing the user to monitor, by utilizing the smartphone, whether a correct dose of medicine is accommodated in a medicine compartment or whether the medicine held in the medicine compartment is taken at a predetermined time.

The communication device may include a communication device utilizing a short-range communication network, for example, Bluetooth, so that the smartphone of the user may be used.

The top cover 4 is rotatably coupled to the main case 1 to selectively open and close the medicine compartments of the medicine case 2 by a rotational motion.

The smart medicine case unit configured as described above derives an advantage of preventing the user from taking the same medicine over again as the smart medicine case unit has an easy-to-carry medicine case structure including a plurality of medicine compartments partitioned to separately accommodate different substances to be taken, such as medicine or dietary supplements, as shown in FIG. 3, and an advantage of allowing the user to monitor, by utilizing a smartphone, whether a correct dose of a substance to be taken is held and whether the substance is taken at a predetermined time, as the smart medicine case unit is configured to sense, through the optical sensors 31, whether a substance to be taken is properly held in each medicine compartment and whether a correct dose of the substance is taken at a predetermined time and transmit the sensed values to the smartphone through a Bluetooth communication network, as shown in FIG. 4.

Meanwhile, as shown in the enlarged part of FIG. 2, the smart medicine case unit includes a Hall sensor 32, a magnet 41, and a magnetic body 5, to sense whether the medicine case 2 is opened or closed according to the rotational motion of the top cover 4.

That is, the Hall sensor 32 is mounted on the circuit board 3 at a position corresponding to the magnet 41, to perform sensing using a Hall effect that a voltage is produced in a direction perpendicular to a current and a magnetic field when a magnetic field is applied to a conductor in which a current flows.

The magnet 41 is arranged in the top cover 4 at a position corresponding to the Hall sensor 32, to form a magnetic field to produce the Hall effect.

The magnet 41 and the Hall sensor 32 are respectively arranged in the top cover 4 and on the circuit board 3 and thus, are structurally separate from each other even when the top cover 4 is at a position to close the medicine case 2. Due to the structural issue, sensing using the Hall effect may not be performed smoothly. To overcome the issue, the smart medicine case unit includes the magnetic body 5 arranged between the Hall sensor 32 and the magnet 41.

That is, the magnetic body 5 is arranged between the Hall sensor 32 and the magnet 41 to allow a magnetic force of the magnet 41 to reach the Hall sensor 32.

The smart medicine case unit configured as described above has an advantage of informing of the number of times the medicine case 2 is opened by sensing, by utilizing the smartphone, whether the top cover 4 is opened or closed, and an advantage of preventing an erroneous record as on-time taking even when a substance to be taken such as medicine or a dietary supplement is taken or refilled, by storing data related to a substance to be taken held in a medicine compartment and transmitting the stored data to the smartphone only when the medicine case 2 is opened and then closed by the rotational motion of the top cover 4, and by preventing storing data if the medicine case 2 is simply opened and not closed.

The smart medicine case unit includes a subcase 6 accommodated in the accommodation space 10 of the main case 1, separate from the medicine case 2.

The subcase 6 is arranged between the circuit board 3 and the medicine case 2, has a single unpartitioned space unlike the main case 1, and includes a plurality of light-transmitting holes 61 formed at positions corresponding to the light-transmitting holes 21 of the medicine case 2.

The subcase 6 may be used together with the medicine case 2 as shown in FIG. 2. However, if the medicine case 2 is separated from the smart medicine case unit as shown in FIG. 5, it is possible to accommodate a relatively large amount of medicine in the smart medicine case unit.

That is, the medicine case 2 has a plurality of partitioned medicine compartments as shown in FIG. 5, and thus, the size of medicine or dietary supplement to be accommodated in each medicine compartment is limited. However, the subcase 6 has the single unpartitioned space and thus, may accommodate medicine that is sold at pharmacies generally in the form of a pack of pills, rather than individual pills, thereby accommodating a relatively large amount of medicine.

Meanwhile, the smart medicine case unit including the subcase 5 may further include a sensing device configured to sense whether the medicine case 2 is separated when only the subcase 6 is used by separating the medicine case 2 from the subcase 6.

That is, the sensing device may include a Hall sensor 33 mounted on the circuit board 3 and a magnet (not shown) provided in the medicine case 2 at a position corresponding to the Hall sensor 33. Since the separation of the medicine case 2 influences the Hall effect produced by the hall sensor 33 and the magnet, the sensing device may smoothly sense whether the medicine case 2 is separated.

Meanwhile, a smart monitoring method for taking medicine is to monitor whether medicine is taken by a user using the smart medicine case unit described above, and has an advantage of promoting the user's health, as the smart monitoring method is configured, as shown in FIGS. 3 and 4, to sense, through the optical sensor 31, whether a pill is placed on a light-transmitting hole 21 of the medicine compartment of the medicine case 2, to transmit a result of the sensing to the mobile terminal of the user through the communication device, and to display, on a display device of the mobile terminal, an image or message corresponding to the result of the sensing and indicating, for example, whether a substance to be taken such as medicine or dietary supplement is carried with him or her and whether a correct dose of the substance is taken at a predetermined time, or to inform the user of the result of the sensing through vibration or sound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A smart medicine case unit, comprising:
   a main case having an accommodation space to store a component therein;
   a medicine case accommodated in the accommodation space of the main case, the medicine case including a plurality of medicine compartments that are partitioned to separately accommodate various types of medicine and respectively include light-transmitting holes through which light is transmitted;
   a circuit board arranged between the medicine case and the main case, wherein an optical sensor provided at a position corresponding to each of the light-transmitting holes and a communication device configured to transmit a signal sensed by the optical sensor to a mobile terminal are mounted on the circuit board;
   a top cover rotatably coupled to the main case to selectively open and close the plurality of medicine compartments of the medicine case by a rotational motion; and
   a subcase accommodated in the accommodation space of the main case, wherein the subcase is arranged between the circuit board and the medicine case, has a single unpartitioned space, and includes a plurality of light-transmitting holes formed at positions corresponding to the light-transmitting holes of the medicine case.

2. The smart medicine case unit of claim 1, further comprising:
   a Hall sensor provided on the circuit board;
   a magnet provided in the top cover at a position corresponding to the Hall sensor; and
   a magnetic body positioned between the Hall sensor and the magnet to allow a magnetic force of the magnet to reach the Hall sensor.

3. The smart medicine case unit of claim 1, further comprising:
   a Hall sensor mounted on the circuit board and a magnet provided in the medicine case at a position corresponding to the Hall sensor, wherein the Hall sensor senses whether the medicine case is separated when the medicine case is separated from the subcase and only the subcase is used.

4. A smart monitoring method for taking medicine, comprising:
   to monitor whether medicine is taken by a user, by using the smart medicine case unit of claim 1,
   sensing, through the optical sensor, whether a pill is placed on a light-transmitting hole of the medicine compartment of the medicine case, transmitting a result of the sensing to the mobile terminal of the user through the communication device, and displaying an image or a message corresponding to the result of the sensing on a display device of the mobile terminal or informing the user of the result of the sensing.

* * * * *